US008791552B2

(12) United States Patent
Nishimura et al.

(10) Patent No.: US 8,791,552 B2
(45) Date of Patent: Jul. 29, 2014

(54) SEMICONDUCTOR MEMORY DEVICE AND METHOD FOR MANUFACTURING THE SAME

(75) Inventors: Jun Nishimura, Kuwana (JP); Nobuaki Yasutake, Yokkaichi (JP); Takayuki Okamura, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/431,330

(22) Filed: Mar. 27, 2012

(65) Prior Publication Data

US 2012/0313065 A1    Dec. 13, 2012

(30) Foreign Application Priority Data

Jun. 10, 2011  (JP) ................. P2011-130662

(51) Int. Cl.
H01L 29/66       (2006.01)
H01L 29/868      (2006.01)
H01L 27/102      (2006.01)
H01L 27/24       (2006.01)
H01L 45/00       (2006.01)

(52) U.S. Cl.
CPC .......... H01L 27/1021 (2013.01); H01L 29/868 (2013.01); H01L 45/04 (2013.01); H01L 45/1233 (2013.01); H01L 45/1675 (2013.01); H01L 45/146 (2013.01); H01L 27/2409 (2013.01); H01L 27/2481 (2013.01)
USPC ............ 257/656; 257/E21.004; 257/E21.645; 257/E29.17

(58) Field of Classification Search
CPC ........................... H01L 29/684; H01L 27/2463
USPC ...................................................... 257/656
See application file for complete search history.

(56) References Cited

U.S. PATENT DOCUMENTS

| 4,857,972 A    * | 8/1989  | Jorke et al. ................ 257/18 |
| 8,027,188 B2     | 9/2011  | Nagashima et al. |
| 2010/0237320 A1* | 9/2010  | Nagashima ................. 257/5 |
| 2011/0026299 A1  | 2/2011  | Kanno et al. |
| 2012/0305879 A1* | 12/2012 | Lu et al. ..................... 257/4 |

FOREIGN PATENT DOCUMENTS

| JP | 2010-103288    | 5/2010 |
| JP | 2010-225741    | 10/2010 |
| WO | WO2010-026654 A1 | 3/2010 |

OTHER PUBLICATIONS

Jones, Diffusion in Silicon, IC Knowledge LLC, p. 24 (2008); http://www-eng.lbl.gov/~shuman/NEXT/MATERIALS&COMPONENTS/Xe_damage/Diffusioniff/020siliconpdf.pdf.*
Office Action mailed Apr. 22, 2014, in Japanese Patent Application No. 2011-130662, (w/English translation), pp. 1-7.

* cited by examiner

Primary Examiner — Victor A Mandala
Assistant Examiner — Christopher Johnson
(74) Attorney, Agent, or Firm — Oblon, Spivak, McClelland, Maier & Neustadt, L.L.P.

(57) ABSTRACT

A semiconductor memory device includes a cell array layer including a first wire, a memory cell stacked on the first wire, and a second wire formed on the memory cell. The memory cell includes a variable resistance element and a current control element The current control element includes a first conductivity-type semiconductor into which a first impurity is doped, an i-type semiconductor in contact with the first conductivity-type semiconductor, a second conductivity-type semiconductor into which a second impurity is doped, and an impact ionization acceleration unit being formed between the i-type semiconductor and one of the first conductivity-type semiconductor and the second conductivity-type semiconductor.

13 Claims, 24 Drawing Sheets

FIG. 3A
FIG. 3B
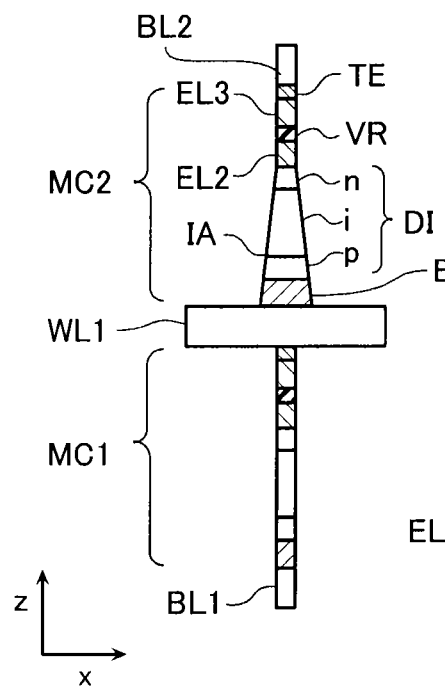
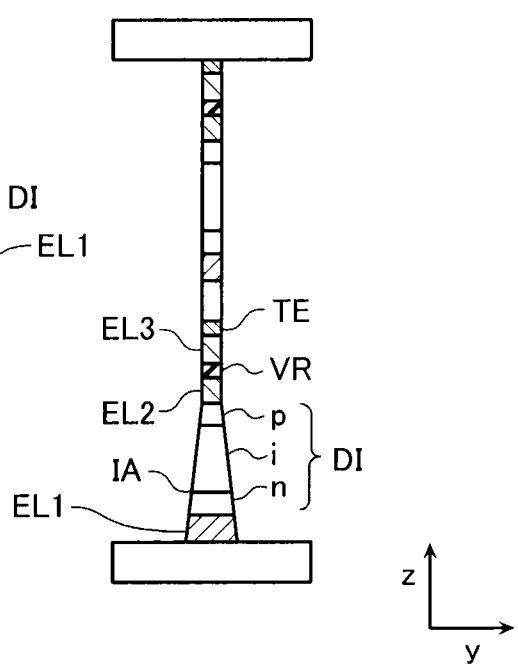
FIG. 4
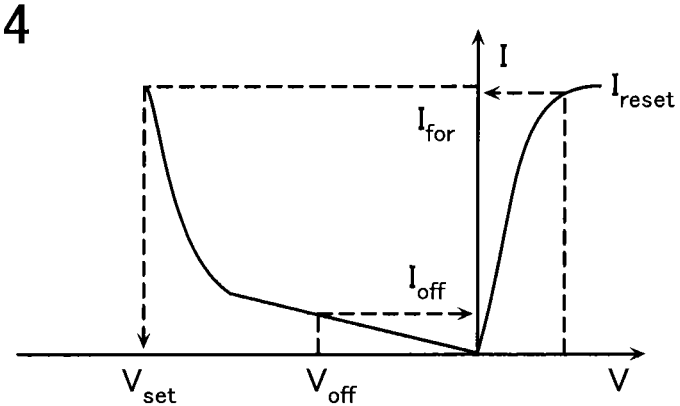

| | PIN Structure | | NIP Structure | |
|---|---|---|---|---|
| | a | b | c | d |
| Configuration | n/i/p | n/i/p | p/i/n | p/i/n |
| $V_{set}$ A | High | Low | Low | High |
| $V_{set}$ B | Low | High | High | Low |
| $I_{off}$ | Middle | Middle | Middle | Middle |
| $I_{for}$ | High | Low | High | Low |

FIG. 7A
FIG. 7B
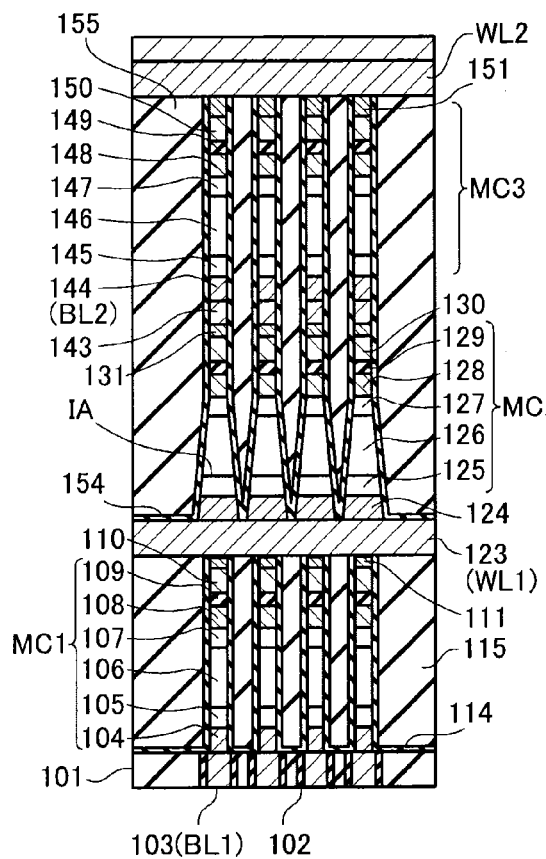
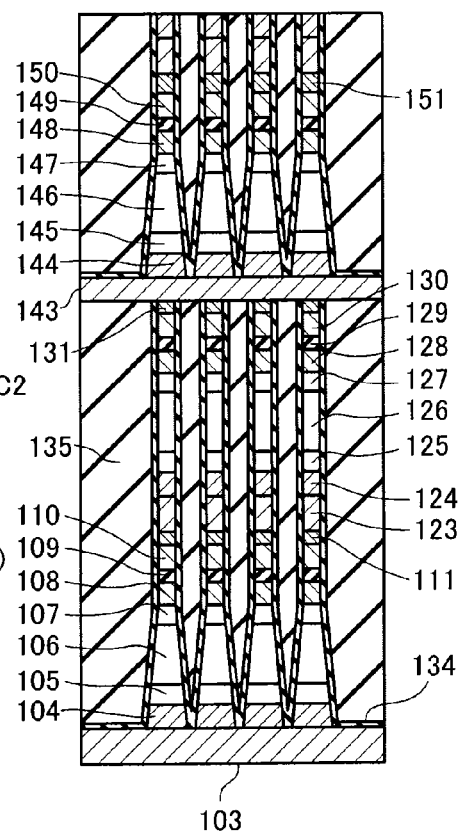

FIG. 22A
FIG. 22B
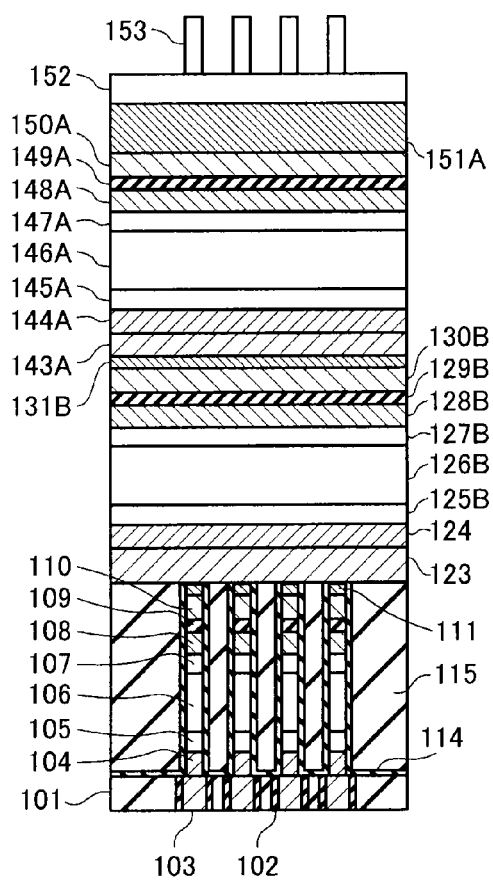
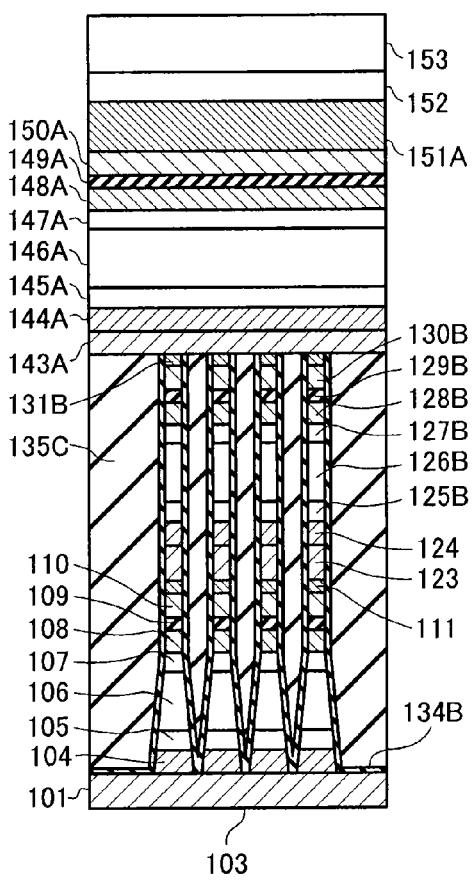

FIG. 23A
FIG. 23B
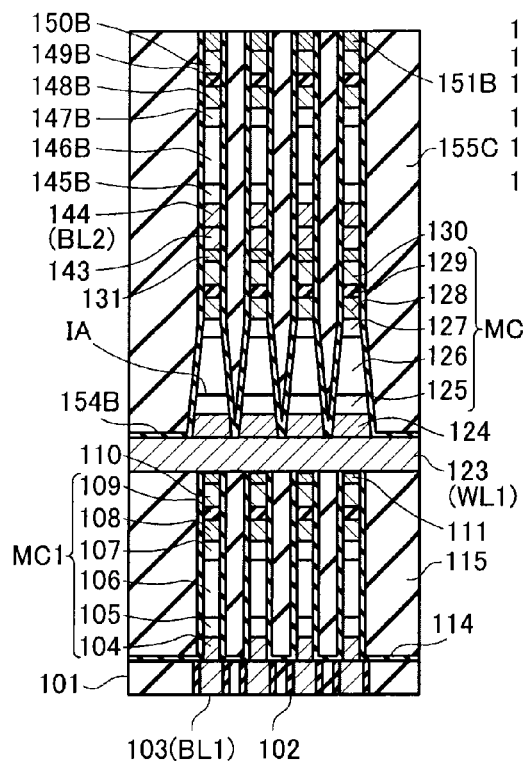
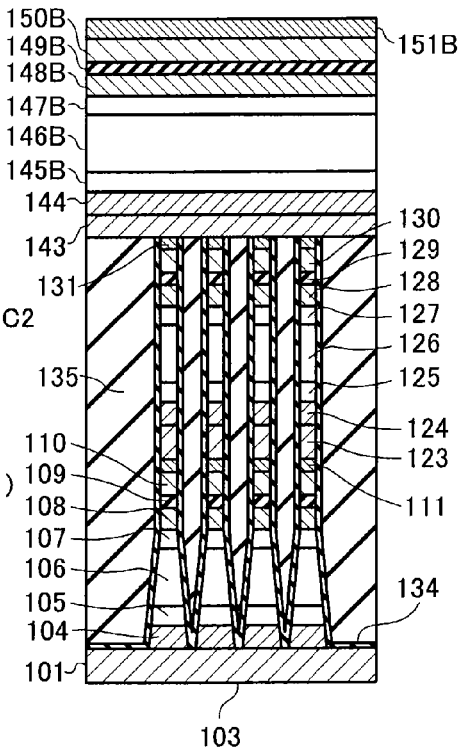

SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-130662, filed on Jun. 10, 2011, the entire contents of which are incorporated herein by reference.

FIELD

Embodiments described herein relate to a semiconductor memory device and a method for manufacturing the same.

BACKGROUND

Description of the Related Art

There has conventionally been known a flash memory, as an electrically rewritable nonvolatile memory, which includes a memory cell array of NAND-connected or NOR-connected memory cells having a floating gate structure. A ferroelectric memory is also known as a nonvolatile fast random access memory.

On the other hand, proposed technologies of further reducing the sizes of memory cells include resistance variable memory, which uses a variable resistance element in a memory cell. Known examples of the variable resistance element include a phase change memory device that varies the resistance value in accordance with the variation in crystal/amorphous states of a chalcogenide compound, an MRAM device that uses a variation in resistance caused by the tunnel magneto-resistance effect, a polymer ferroelectric RAM (PFRAM) memory device including resistance elements formed of a conductive polymer, and a ReRAM device that causes a variation in resistance by electrical pulse application.

There are two operation modes in the variable resistance element used for these resistance variable memories. One of them is such that the high-resistance state and the low-resistance state are changed by changing the polarity of the applied voltage. This mode is referred to as a bipolar type. The other one is such that the high-resistance state and the low-resistance state are changed by the control of the voltage value and the application time without changing the polarity of the applied voltage. This mode is referred to as a unipolar type.

In the bipolar type, it is necessary to pass a forward current and a backward current through the variable resistance element. Known examples of elements for passing currents in both directions include an MIM diode and a PIN diode. This kind of diode uses not only the forward current but also, e.g., a tunnel current and a breakdown current as the backward current. In the semiconductor memory device, it is desired to reduce the voltage required to generate sufficient backward current.

BRIEF DESCRIPTION OF THE DRAWINGS

FIGS. 3A and 3B are cross sectional views illustrating a configuration of a memory cell of the semiconductor memory device according to the embodiment;

FIG. 4 is a current-voltage characteristic of a current control element of the semiconductor memory device according to the embodiment;

FIGS. 7A and 7B are cross sectional views illustrating portions of a memory cell array in the semiconductor memory device according to the embodiment;

FIGS. 22A and 22B are a top view and a side view for explaining a method for making the semiconductor memory device;

FIGS. 23A and 23B are a top view and a side view for explaining a method for making the semiconductor memory device;

DETAILED DESCRIPTION

A semiconductor memory device according to an embodiment includes a cell array layer including a first wire, a memory cell stacked on the first wire, and a second wire formed on the memory cell so as to cross the first wire. The memory cell includes a variable resistance element that is electrically rewritable by applying an electric signal having a different polarity and a current control element connected in series and passing currents in both directions through the variable resistance element. The current control element includes a first conductivity-type semiconductor into which a first impurity is doped, an i-type semiconductor in contact with the first conductivity-type semiconductor, a second conductivity-type semiconductor into which a second impurity is doped, and the second conductivity-type semiconductor being in contact with the i-type semiconductor opposite to the first conductivity-type semiconductor and an impact ionization acceleration unit. The impact ionization acceleration unit is formed between the i-type semiconductor and one of the first conductivity-type semiconductor and the second conductivity-type semiconductor, and the impact ionization acceleration unit generates more impact ions than between the i-type semiconductor and the other of the first conductivity-type semiconductor and the second conductivity-type semiconductor.

Hereinafter, embodiments will be explained with reference to the attached drawings.

First Embodiment

Overall Configuration

Figure 1:
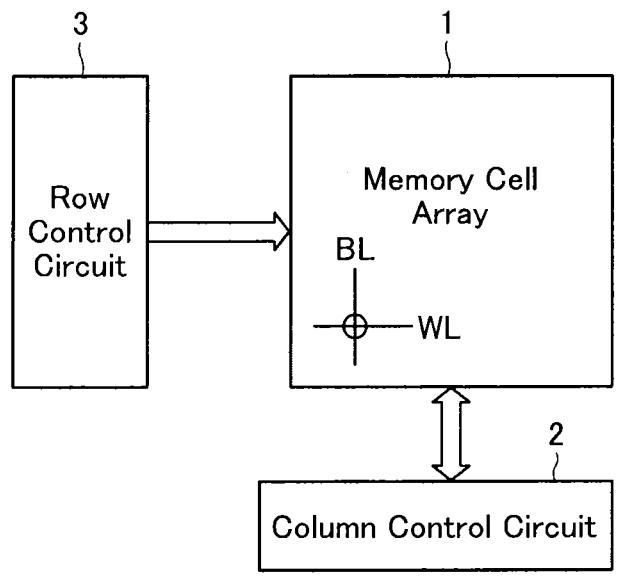
FIG. 1 is a block diagram illustrating a configuration of a semiconductor memory device according to the first embodiment.

FIG. 1 is a block diagram illustrating a configuration of a semiconductor memory device according to the first embodiment. This semiconductor memory device includes a memory cell array 1 in which memory cells MC having variable resistance elements and current control elements later explained are arranged in a matrix form.

A column control circuit 2 is electrically connected to bit lines BL of the memory cell array 1. The column control circuit 2 controls the bit lines BL of the memory cell array 1, and enables data erase operation of a memory cell, data write operation to a memory cell, and data read operation from a memory cell. A row control circuit 3 is electrically connected to word lines WL of the memory cell array 1. The row control circuit 3 selects the word lines WL of the memory cell array 1, and enables data erase operation of a memory cell, data write operation to a memory cell, and data read operation from a memory cell.

[Memory Cell Array]

Figure 2:
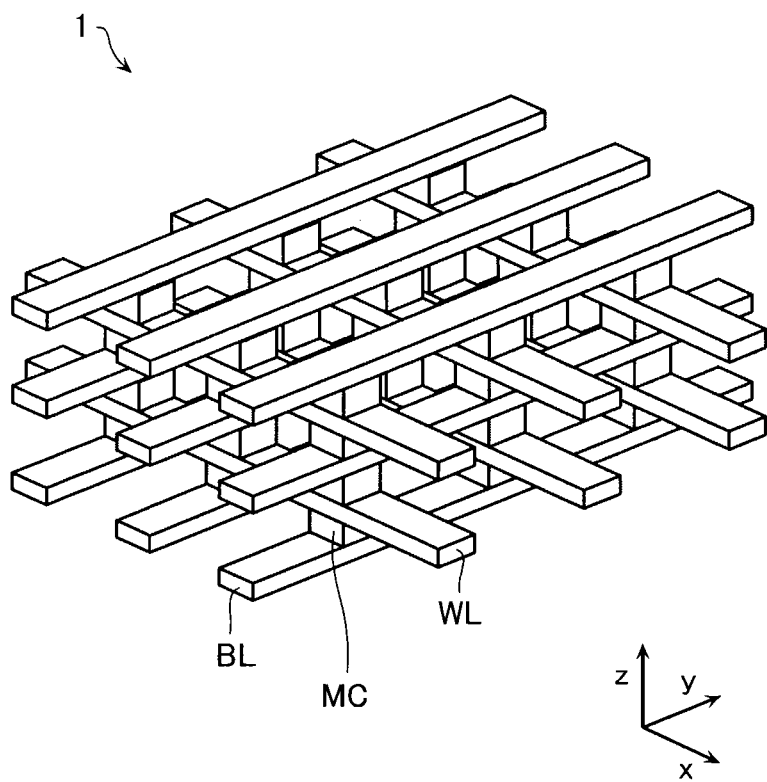
FIG. 2 is a perspective view illustrating a portion of a memory cell array of the semiconductor memory device according to the embodiment.

FIG. 2 is a perspective view illustrating a portion of the memory cell array 1. The memory cell array 1 is a cross point-type memory cell array. In the memory cell array 1, the plurality of word lines WL are arranged in parallel, and the plurality of bit lines BL crossing the word lines WL are arranged in parallel. A memory cell MC later explained is arranged at each crossing portion of a word line WL and a bit line BL in such a manner that the memory cell MC is sandwiched between both of the wires. Such memory cell arrays are formed as a multilayer with adjacent word lines WL and bit lines BL being shared. It should be noted that the word lines WL and the bit lines BL are desirably made of a material with a high degree of heat resistance and a low electrical resistance value. Examples of such materials include Tungsten (W), titanium (Ti), tungsten nitride (WN), titanium nitride (TiN), tungsten silicide (WSi), nickel silicide (NiSi), and cobalt silicide (CoSi).

[Memory Cell MC]

FIG. 3A is a cross sectional view illustrating the memory cell MC1 and MC2 in bit line BL direction (zx plane of FIG. 2), and FIG. 3B is a cross sectional view thereof in word line WL direction (zy plane of FIG. 2). The memory cell array 1 includes a plurality of memory cells MC, and the memory cell MC includes an electrode EL1 formed on the word line WL or the bit line BL, a tapered current control element DI, an electrode EL2 formed on the current control element DI, a variable resistance element VR formed on the electrode EL2, an electrode EL3 formed on the variable resistance element VR, and a top electrode TE.

[Variable Resistance Element VR]

The variable resistance element VR is formed of material that can change its resistance value through an electric current, heat, chemical energy caused by an application of a voltage, such as titanium dioxide ($TiO_2$), nickel oxide (NiO), metal oxide film (MeOx), hafnium oxide (HfO), and carbon. Electrodes EL2 and EL3 functioning as a barrier metal and an adhesive layer are located above and below the variable resistance element device VR. In addition, it is also possible to insert a metal film uniformizing orientation characteristics. In addition, a buffer layer, a barrier metal layer, an adhesive layer, or the like may be inserted.

In the present embodiment, the variable resistance element VR is bipolar type. The variable resistance element VR stores resistance as data. The bipolar type variable resistance element VR decreases its resistance upon application of a voltage in a reverse direction, and increases its resistance upon supply of a current in a forward direction. Hereinafter, operation for decreasing the resistance by applying a voltage in the reverse direction to the bipolar type variable resistance element VR will be referred to as set operation, and operation for increasing the resistance by supplying a current in the forward direction to the bipolar type variable resistance element VR will be referred to as reset operation.

[Current Control Element DI]

In the present embodiment, the current control element DI employs a PIN diode or an NIP diode made by stacking a p-type semiconductor, an i-type semiconductor, and an n-type semiconductor. In memory cell arrays in odd-numbered layers, the NIP diode is employed in which the n-type semiconductor, the i-type semiconductor, and the p-type semiconductor are arranged in this order from the bottom. In memory cell arrays in even-numbered layers, the PIN diode is employed in which the p-type semiconductor, the i-type semiconductor, and the n-type semiconductor are arranged in this order from the bottom. The current control element DI has a tapered shape. The tapered shape is such that the width in a direction in which the bit line BL or the word line WL connected at the lower end extends increases gradually from the upper end to the lower end. A portion having a wide width, i.e., the interface between the n-type semiconductor and the i-type semiconductor in the odd-numbered layers and the interface between the p-type semiconductor and the i-type semiconductor in the even-numbered layers, serves as an impact ionization acceleration unit IA explained later.

[Operation Characteristic of Current Control Element DI]

FIG. 4 is a current-voltage characteristic of the current control element DI of the present embodiment. The horizontal axis represents an applied voltage V to the current control element DI, and the vertical axis represents the absolute value of a current I flowing through the current control element DI.

When a current in a reverse direction voltage region of the current control element DI is considered, a current caused by interband tunneling and trap-assisted tunneling is dominant in a low voltage region, and the current is relatively suppressed. In contrast, in a high voltage region, a current caused by avalanche breakdown by impact ionization is dominant, and the current I increases rapidly according to increase of the applied voltage V to the current control element DI.

As described above, in the semiconductor memory device according to the present embodiment, set operation is performed by applying a reverse direction voltage to the variable resistance element VR. In this case, where the reverse direction voltage required for the set operation is denoted as set voltage Vset, it is necessary to supply the current Ioff of a certain level with the set voltage Vset. In order to supply the predetermined current Ioff to the variable resistance element VR, it is necessary to apply a set voltage Vset such that avalanche breakdown is induced in the current control element DI. However, when the set voltage Vset is high, this may cause a problem in that it is necessary to increase the breakdown voltage and the like of the transistors related to the set operation. Therefore, how to reduce the set voltage Vset is the problem to be solved. It should be noted that, in the present embodiment, the set operation is performed by applying the reverse direction voltage to the variable resistance element VR, but it is also possible to perform the set operation by applying the forward direction voltage.

Figures 5, 6:
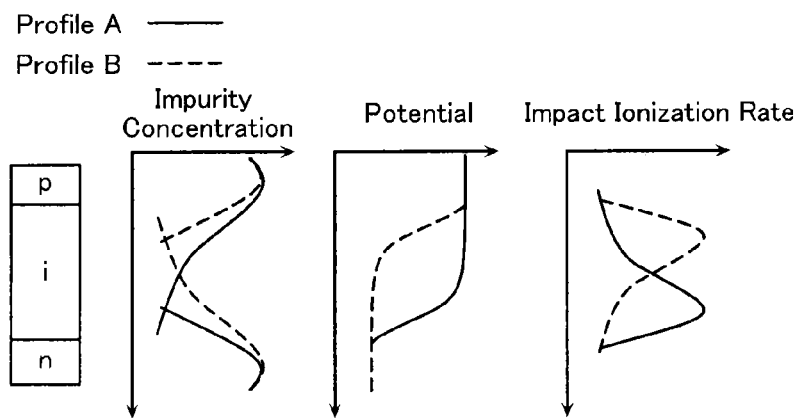
FIG. 5 is a graph illustrating distribution of impurity concentration, potential, and impact ionization rate in two types of PIN diodes.
FIG. 6 is a table illustrating characteristics of Vset, Ioff, and Ifor when impurity concentration is changed in four types of PIN diodes having different polarities and shapes.

As described above, the set voltage Vset corresponds to the voltage at which the avalanche breakdown occurs, and the avalanche breakdown is related to the amount of generated impact ion in the current control element DI. FIG. 5 is a graph illustrating distribution of impurity concentration, potential, and impact ionization rate in two types of PIN diodes. Two types of impurities having different diffusion lengths are injected into the p-layer and the n-layer of the PIN diode. In the graph of FIG. 5, a profile A is denoted as a solid line, and a profile B is denoted as a broken line. In the profile A, the diffusion length of the impurity (for example, boron (B)) injected into the p-layer is longer than the diffusion length of the impurity (for example, phosphorus (P)) injected into the n-layer. In the profile B, the diffusion length of the impurity injected into the n-layer is longer than the diffusion length of the impurity injected into the p-layer.

In the profile A, the diffusion length of the impurity injected into the p-layer is longer than the film thickness of the i-layer, and accordingly the impurity in the p-layer diffuses to the i-layer, but diffusion of the impurity in the n-layer is suppressed. Therefore, in the PIN diode having the profile A, the potential rapidly changes at the junction interface between the i-layer and the n-layer, and impact ions are likely to be generated. On the other hand, in the profile B, since the diffusion length of the impurity injected into the n-layer is longer than the film thickness of the i-layer, the impurity of the n-layer diffuses to the i-layer, but diffusion of the impurity in the p-layer is suppressed. Therefore, in the PIN diode having the profile B, the potential rapidly changes at the junction interface between the i-layer and the p-layer, and impact ions are likely to be generated.

FIG. 6 is a table illustrating characteristics of Vset, Ioff, and Ifor when the profile A and the profile B are applied to four types of PIN diodes having different polarities and shapes. Among the four types of PIN diodes, a PIN diode having a PIN structure (arranged from the lower side) and of a tapered type is referred to as configuration "a", and a PIN diode having a PIN structure (arranged from the lower side) and of a inverse tapered type is referred to as configuration "b". A PIN diode having a NIP structure (arranged from the lower side) and of a tapered type is referred to as configuration "c", and a PIN diode having a NIP structure (arranged from the lower side) and of a inverse tapered type is referred to as configuration "d".

First, the set voltage Vset is described. In the profile A, the impact ionization rate at the interface between the i-layer and the n-layer is high. Therefore, in the configuration "b" and the configuration "c" in which this portion is formed to be wide, the set voltage Vset is reduced. On the other hand, in the profile B, the impact ionization rate at the interface between the i-layer and the p-layer is high. Therefore, in the configuration "a" and the configuration "d" in which this portion is formed to be wide, the set voltage Vset is reduced. Regardless of the configuration, the leak current Ioff is substantially the same. When the forward current Ifor related to the reset current Ireset is considered, a certain amount of current is ensured in the configuration "a" and configuration "c" in which the shape is tapered, but in the forward current Ifor decreases in the configuration "b" and configuration "d" in which the shape is inverse tapered. Therefore, with the configuration "a" of the profile B and the configuration "c" of the profile A, the current control element DI capable of reducing the set voltage Vset can be supplied. In addition, in the configuration "a" and configuration "c", the shape is tapered, and therefore, the configuration "a" and configuration "c" can be manufactured easily as compared with the configuration "b" and "d" in which the shape is inverse tapered. Therefore, the configuration "a" of the profile B for the diode of the PIN structure and the configuration "c" of the profile A for the diode of the NIP structure can be used as the current control element DI capable of reducing the set voltage Vset and ensuring a certain level of reset current Ireset.

In the present embodiment, in view of the above points, the current control element DI of the memory cell MC1 of the odd-numbered layers in FIG. 3 is formed in the profile A, and the interface between the n-type semiconductor and the i-type semiconductor, i.e., a wide width portion, is adopted as the impact ionization acceleration unit IA. On the other hand, the current control element DI of the memory cell MC2 of the even-numbered layers in FIG. 3 is formed in the profile B, and the interface between the p-type semiconductor and the i-type semiconductor, i.e., a wide width portion, is adopted as the impact ionization acceleration unit IA.

[Specific Example of Memory Cell Array]

FIGS. 7A and 7B are cross sectional views illustrating portions of the memory cell array in the semiconductor memory device according to the embodiment in more detail. In the memory cell array MA according to the present embodiment, on an inter-layer insulating body 101 having bit lines 103 (BL1) embedded therein, a plurality of layers of memory cell arrays MA are configured to be stacked via the bit lines BL and the word lines WL. In the first stage, a plurality of memory cells MC 1 is formed. In the second stage, a plurality of memory cells MC2 is formed. In the third stage, a plurality of memory cell MC3 is formed. The memory cell MC1 is made by stacking an electrode 104 (EL1), semiconductors 105 to 107 (DI), an electrode 108 (EL2), a variable resistance element VR (109), an electrode 110 (EL3), and a top electrode 111 (TE). In the memory cell MC1, the current control element DI in the first layer including the semiconductors 105 to 107 has a tapered shape in the cross section in the bit line BL direction, and the current control elements DI are formed with a predetermined interval on the bit line 103. Since the bit line 103 is a common electrode, no problem would be caused in operation even if the n-type semiconductor layers 105 are in contact with each other as long as the interface portions between the n-type semiconductor layer 105 and the i-type semiconductor layer 106 of adjacent memory cells MC1 are not in contact with each other. When the interval between the memory cells MC and the like is considered, the taper angle may be reduced to about 78 degrees. It should be noted that the memory cell MC2 is pivoted 90 degrees with respect to the memory cell MC1, and the memory cell MC3 is pivoted 90 degrees with respect to the memory cell MC2. The current control elements DI of the memory cells MC1, MC3 are formed in the profile A (configuration "c") in the NIP structure from the bottom. The current control element DI of the memory cell MC2 is formed in the profile B (configuration "a") in the PIN structure from the bottom. The memory cells MC2 and MC3 are configured to be substantially the same as the memory cell MC1.

According to this configuration, the breakdown voltage of the CMOS transistor can be reduced by reduction of Vset. In addition, when Vset decreases, it is also possible to reduce the unselected voltage Voff, and therefore, the leak current Ioff is also reduced, which achieves low power consumption. In addition, the reduction of the leak current Ioff can improve the influence exerted on the probability of the switching with IRDrop and the speed of the switching.

[Manufacturing Method of Semiconductor Memory Device]

Subsequently, with reference to FIGS. 8A to 23B, the manufacturing method of the semiconductor memory device according to the present embodiment will be explained.

Figure 8A:
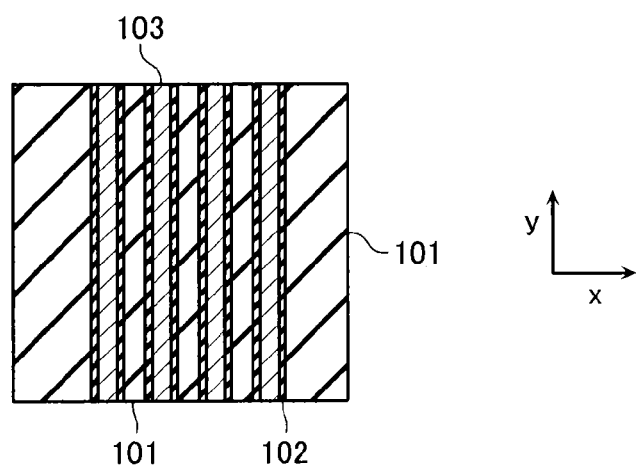
FIGS. 8A to 8C are a top view, a front view, and a side view for explaining a method for making a semiconductor memory device according to the first embodiment.
Figure 8B:
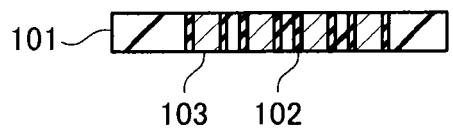
Figure 8C:
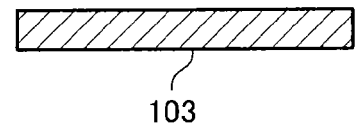

First, as shown in FIGS. 8A to 8C, the inter-layer insulating layers 101 and the bit lines 103 of which sidewalls are covered with barrier layers 102 are formed by embedding method or RIE. The barrier layer 102 may be an insulating body such as SiN. The bit lines 103 extending the y direction, and are arranged in the x direction.

Figure 9A:
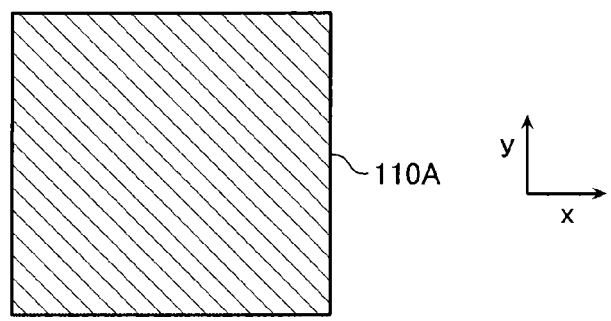
FIGS. 9A to 9C are a top view, a front view, and a side view for explaining a method for making the semiconductor memory device.
Figure 9B:
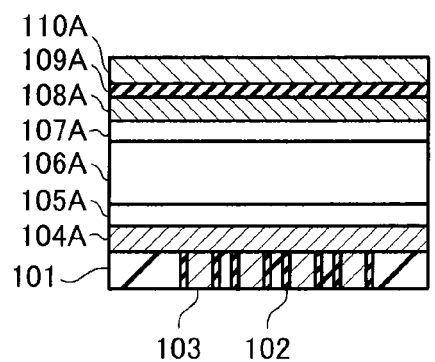
Figure 9C:
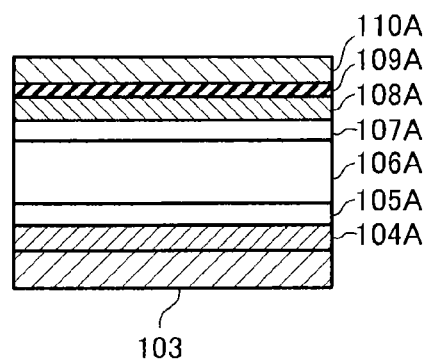

Subsequently, as shown in FIGS. 9A to 9C, a conductive layer 104A serving as an electrode 104, an n-type semiconductor layer 105A, an i-type semiconductor layer 106A, a p-type semiconductor layer 107A, a conductive layer 108A serving as an electrode 108, a variable resistance layer 109A serving as a variable resistance element 109, and a conductive layer 110A serving as an electrode 110 are deposited on the inter-layer insulating layer 101. The conductive layers 104A and 110A may be a conductive body such as TiN, and the conductive layer 108A may be a conductive body such as TiN and Ti. The variable resistance layer 109A may be $TiO_2$, NiO, MeOx, HfO, Carbon, and the like. The semiconductor layers 105A to 107A is the NIP-type diode from the bottom, and therefore, the diode layer is formed to have the profile A. In other words, when the semiconductor layers 105A to 107A are deposited, diffusion of the impurity from the n-type semiconductor layer 105A is suppressed as compared with the diffusion of the impurity from the p-type semiconductor layer 107A. More specifically, the profile A can be formed by using the following method.

(1) Arsenic (As) having a diffusion length shorter than phosphorus (P) is used as impurity for the n-type semiconductor layer 105A.

(2) After phosphorus (P) is injected as impurity into the n-type semiconductor layer 105A, the i-type semiconductor layer 106A is deposited using disilane ($Si_2H_6$) gas having a growth rate higher than mono-silane ($SiH_4$) gas, so that this suppresses diffusion of impurity (P) during deposition of the i-type semiconductor layer 106A.

(3) The concentration of impurity during formation of the n-type semiconductor layer 105A is set at a concentration lower by one or two orders of magnitude, so that diffusion of the impurity is suppressed.

Figure 10A:
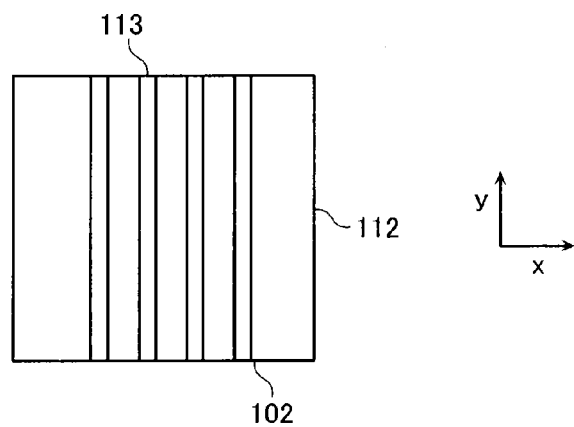
FIGS. 10A to 10C are a top view, a front view, and a side view for explaining a method for making the semiconductor memory device.
Figure 10B:
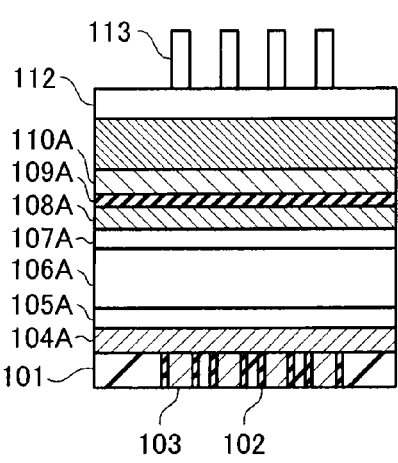
Figure 10C:
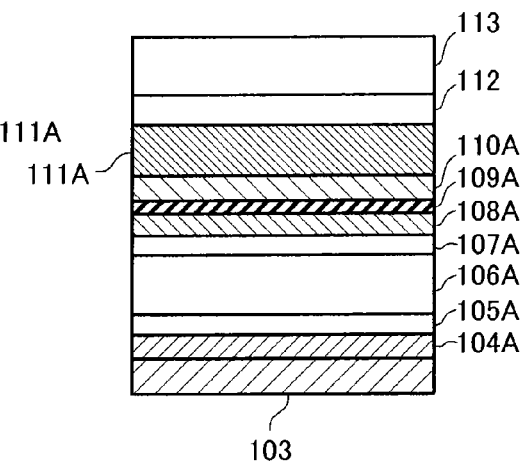

Subsequently, as shown in FIGS. 10A to 10C, a conductive layer 111A serving as a top electrode 111 and an HM (hard-mask) layer 112 are deposited on the conductive layer 110A, and a line and space resist pattern 113 is formed thereon. The conductive layer 111A may be a conductive body such as W, and the HM layer 112 may be $SiO_2$, SiN, C, and the like. Applicable patterning processes of the resist pattern 113 include sidewall transfer method and ArF immersion patterning processes. The resist pattern 113 is formed to overlap the bit lines 103 in the xy plane.

Figure 11A:
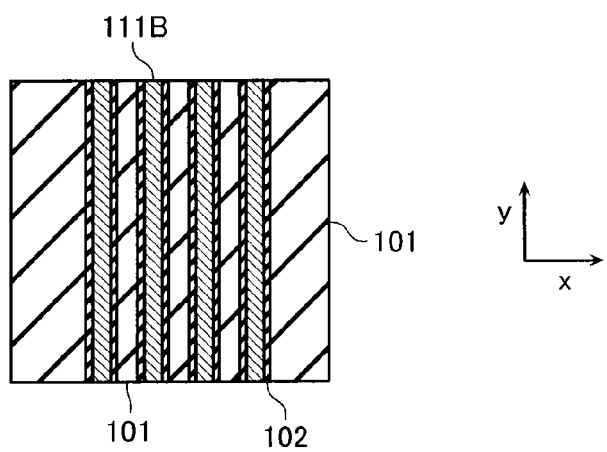
FIGS. 11A to 11C are a top view, a front view, and a side view for explaining a method for making the semiconductor memory device.
Figure 11B:
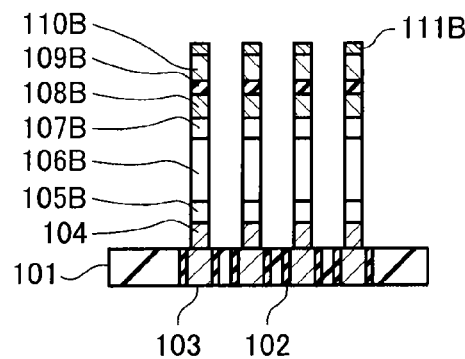
Figure 11C:
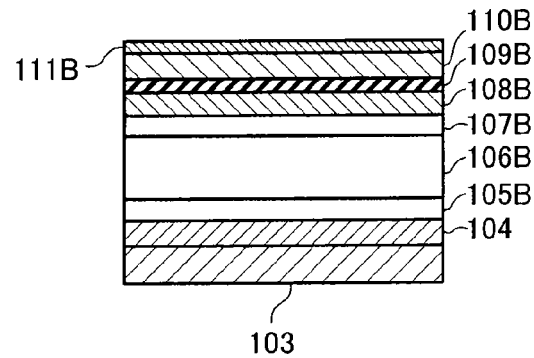

Subsequently, as shown in FIGS. 11A to 11C, using the resist pattern 113 as a mask, the HM layer 112 and conductive layer 111A are processed by etching. Thereafter, using the processed HM layer 112 as a mask, the range from the conductive layer 104A to the conductive layer 110A is etched. Thereby, the structure is formed along the bit lines 103, in which the electrode 104, the n-type semiconductor layer 105B, the i-type semiconductor layer 106B, the p-type semiconductor layer 107B, the conductive layer 108B, the variable resistance layer 109B, the conductive layer 110B, and the conductive layer 111B are stacked. At this occasion, the sidewall from the electrode 104 to the conductive layer 111B is formed to be substantially perpendicular to the surface of the inter-layer insulating layer 101.

Figure 12A:
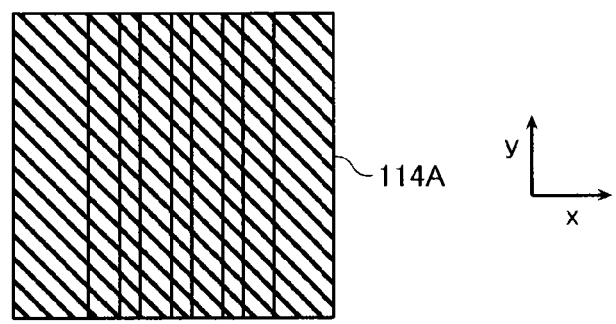
FIGS. 12A to 12C are a top view, a front view, and a side view for explaining a method for making the semiconductor memory device.
Figure 12B:
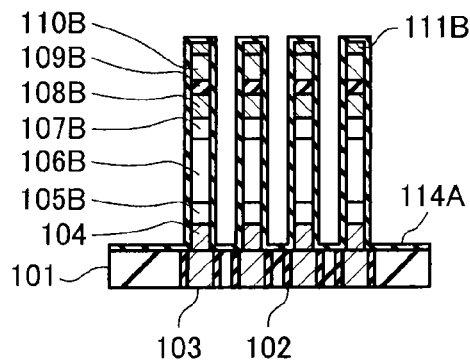
Figure 12C:
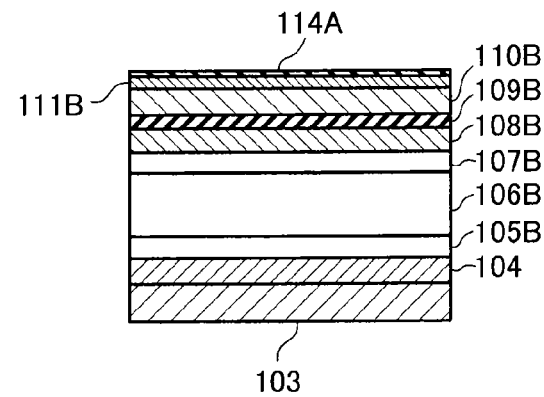

Subsequently, as shown in FIGS. 12A to 12C, an insulating layer 114A is formed to cover the surface of the inter-layer insulating layer 101, the sidewalls extending from the conductive layer 104 to the conductive layer 111B, and the upper surfaces of the conductive layers 111B. The insulating layer 114A may be ALD-SiN, PeCVD-SiN, and the like.

Figure 13A:
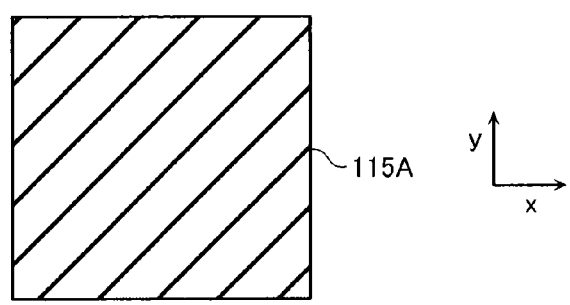
FIGS. 13A to 13C are a top view, a front view, and a side view for explaining a method for making the semiconductor memory device.
Figure 13B:
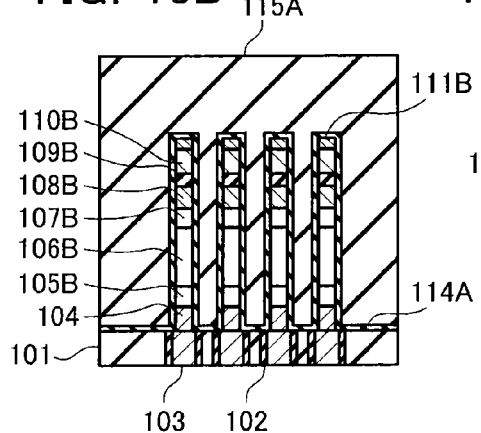
Figure 13C:
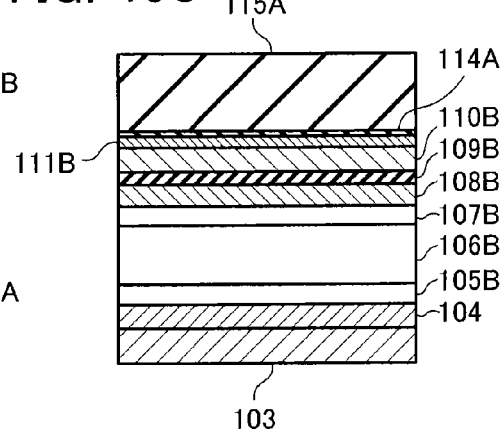
Figure 14A:
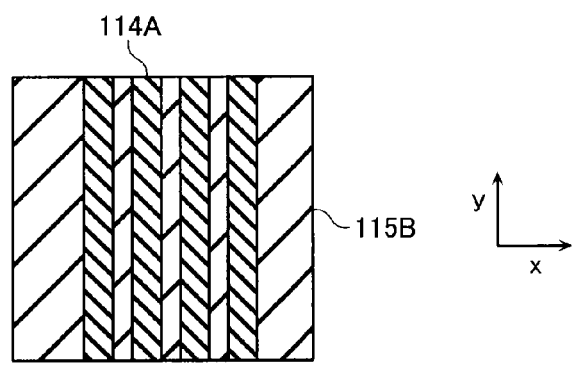
FIGS. 14A to 14C are a top view, a front view, and a side view for explaining a method for making the semiconductor memory device.
Figure 14B:
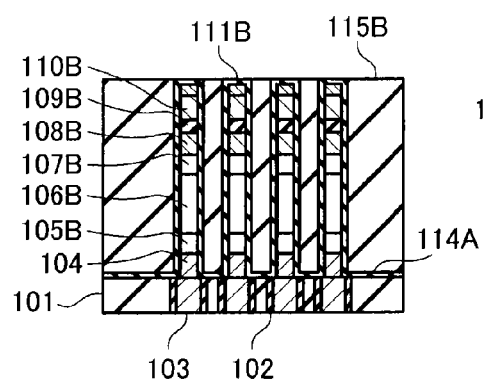
Figure 14C:
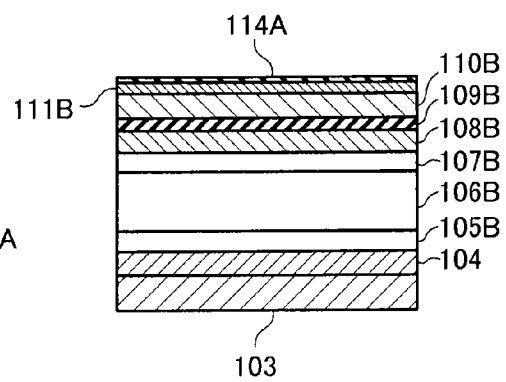
Figure 15A:
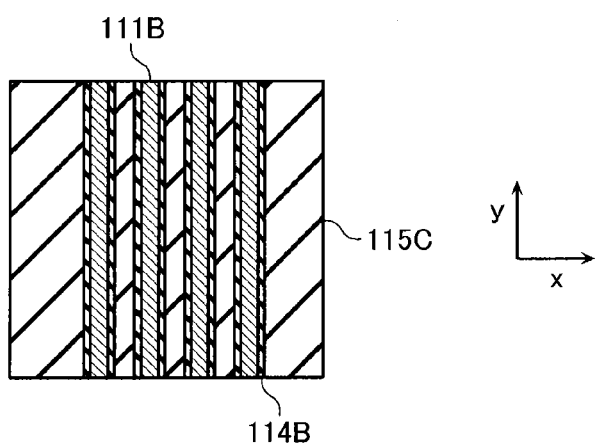
FIGS. 15A to 15C are a top view, a front view, and a side view for explaining a method for making the semiconductor memory device.
Figure 15B:
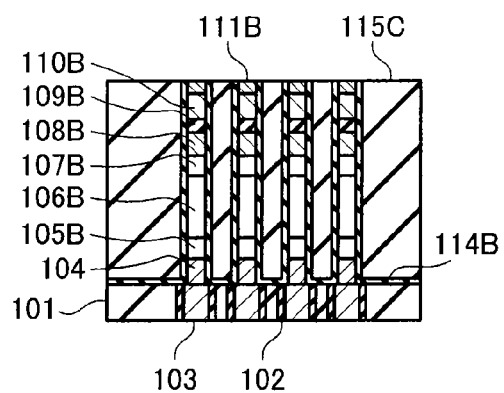
Figure 15C:
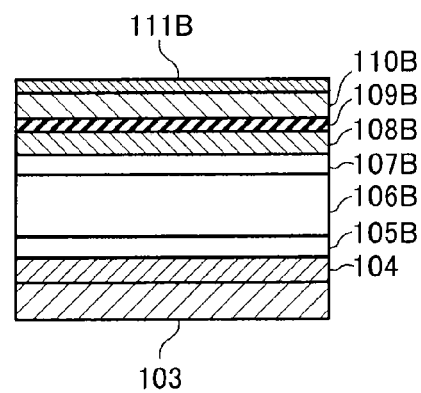

Subsequently, as shown in FIGS. 13A to 13C, the inter-layer insulating layer 115A is deposited, and steam oxidation is performed. However, if the inter-layer insulating layer 115A is not a coating layer, steam oxidation processing is not necessary. Thereafter, as shown in FIGS. 14A to 14C, the inter-layer insulating layer 115A is subjected to CMP until the insulating layer 114A is exposed, so that the inter-layer insulating layer 115B is formed. Subsequently, as shown in FIGS. 15A to 15C, the exposed insulating layer 114A as well as the inter-layer insulating layer 115B are removed by CMP until the conductive layer 111B is exposed, so that the insulating layer 114B and the inter-layer insulating layer 115O are formed.

Figure 16A:
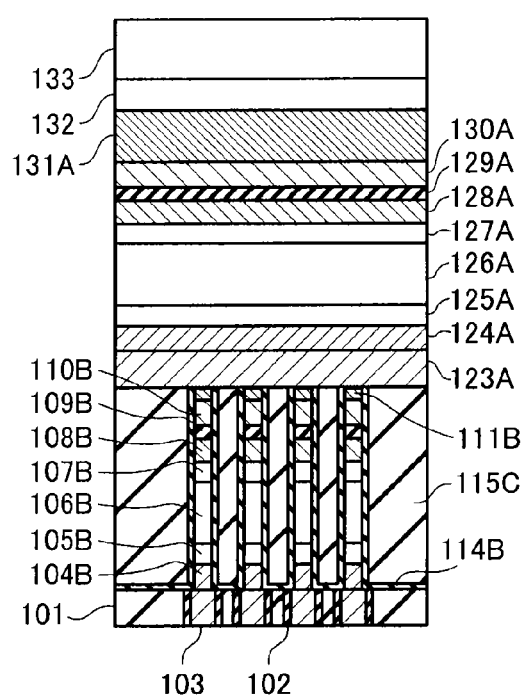
FIGS. 16A and 16B are a top view and a side view for explaining a method for making the semiconductor memory device.
Figure 16B:
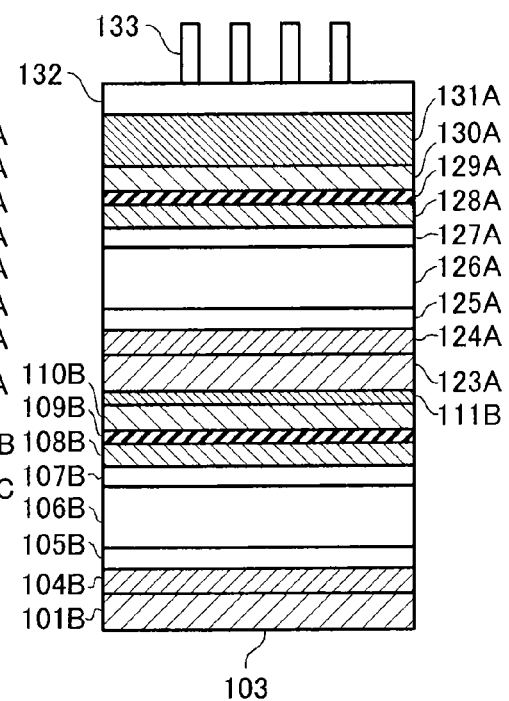

Subsequently, as shown in FIGS. 16A and 16B, a conductive layer 123A serving as a word line WL1, a conductive layer 124A, a p-type semiconductor layer 125A, an i-type semiconductor layer 126A, an n-type semiconductor layer 127A, a conductive layer 128A, a variable resistance layer 129A, a conductive layer 130A, a conductive layer 131A, an HM layer 132, and a resist pattern 133 are formed according to substantially the same steps as the steps shown in FIGS. 9A to 9C and FIGS. 10A to 10C. The materials for the conductive layer 124A to the HM layer 132A may be the materials used in the layers corresponding to the respective layers from the conductive layer 104A to the HM layer 112A. Like FIGS. 9A to 9C, the semiconductor layers 125A to 127A are a diode of PIN-type from the bottom, and therefore, the semiconductor layers 125A to 127A are made to have the profile B. In other words, when the semiconductor layers 125A to 127A are deposited, diffusion of the impurity from the p-type semiconductor layer 125A is suppressed as compared with the diffusion of the impurity from the n-type semiconductor layer 127A. When P (phosphorus) is used as the impurity for the n-type semiconductor layer, and B (boron) is used as the impurity for the p-type semiconductor, P (phosphorus) has a longer diffusion length in general, and therefore, the profile B can be achieved if appropriate thermal step is performed after the semiconductor layers 125A to 127A are deposited. Further, the resist pattern 133 is a line-and-space formed to be perpendicular to the bit lines BL within the xy plane. In FIGS. 9A to 9C, the n-type semiconductor layer 105A, the i-type semiconductor layer 106A, and the p-type semiconductor layer 107A are deposited in this order from the side closer to the conductive layer 104A on the surface of the inter-layer insulating layer 101. In contrast, in FIGS. 16A and 16B, the p-type semiconductor layer 125A, the i-type semiconductor layer 126A, and the n-type semiconductor layer 127A are deposited in this order from the side closer to the conductive body 124A. This is because in the semiconductor memory device according to the present embodiment, a direction from the bit line BL to the word line WL via the memory cell MC is referred to as a forward direction of current.

Figure 17A:
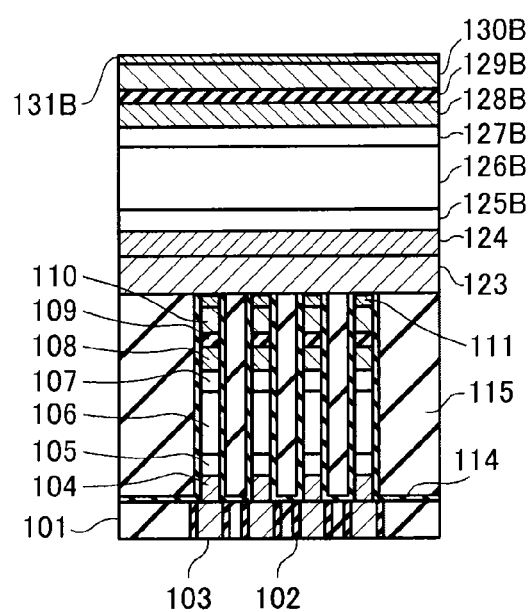
FIGS. 17A and 17B are a top view and a side view for explaining a method for making the semiconductor memory device.
Figure 17B:
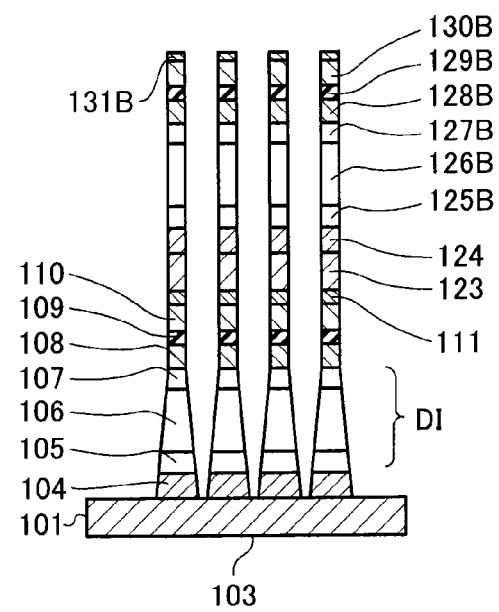

Subsequently, as shown in FIGS. 17A and 17B, etching process is performed according to substantially the same steps as those in FIGS. 11A to 11C. A stacked layer structure is formed in a linear manner perpendicular to the bit lines 103 within the xy plane. The stacked layer structure includes a word line 123, an electrode 124, a p-type semiconductor layer 125B, an i-type semiconductor layer 126B, an n-type semiconductor layer 127B, a conductive layer 128B, a variable resistance layer 129B, a conductive layer 130B, and a conductive layer 131B. The memory cell MC is formed by the stacked layer structure including the conductive layer 104, the n-type semiconductor 105, the i-type semiconductor 106, the p-type semiconductor 107, the electrode 108, the variable resistance element 109, the electrode 110, and the top electrode 111. It should be noted that the p-type semiconductor 105, the i-type semiconductor 106, and the n-type semiconductor 107 are formed to be the tapered type diode DI. At this occasion, a lower part of the diode DI may be in contact with an adjacent diode DI. Methods for forming the tapered shape include reducing the power of the etching gas, reducing chlorine gas, and the like.

Figure 18A:
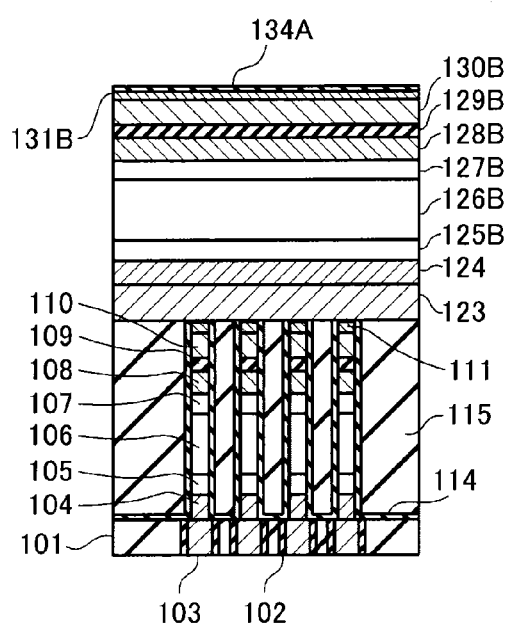
FIGS. 18A and 18B are a top view and a side view for explaining a method for making the semiconductor memory device.
Figure 18B:
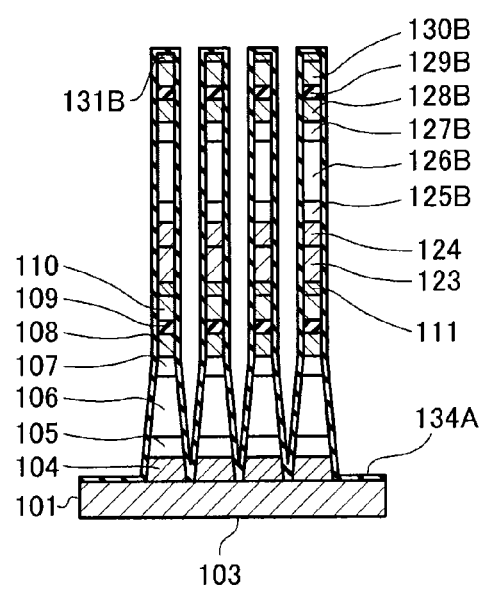

Subsequently, as shown in FIGS. 18A and 18B, a insulating layer 134A is formed to cover the upper surface of the bit lines 103, the side walls extending from the n-type semiconductor 105 to the conductive layer 131B, and the upper surfaces of the conductive layers 131B. The same material as the material for the insulating layer 114 can be used for the insulating layer 134A.

Figure 19A:
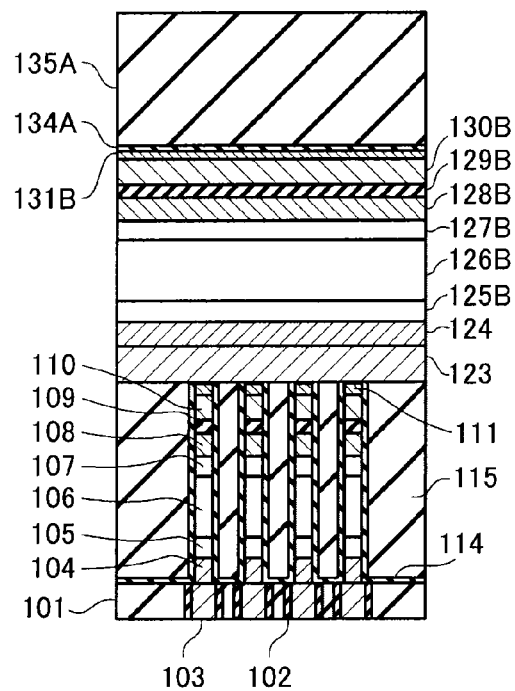
FIGS. 19A and 19B are a top view and a side view for explaining a method for making the semiconductor memory device.
Figure 19B:
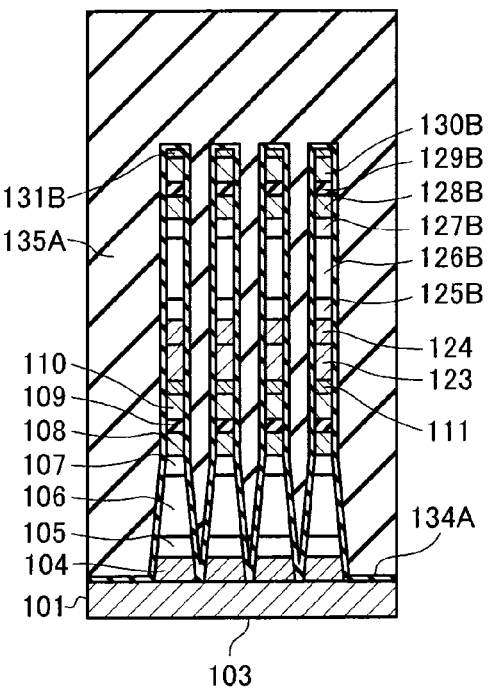
Figure 20A:
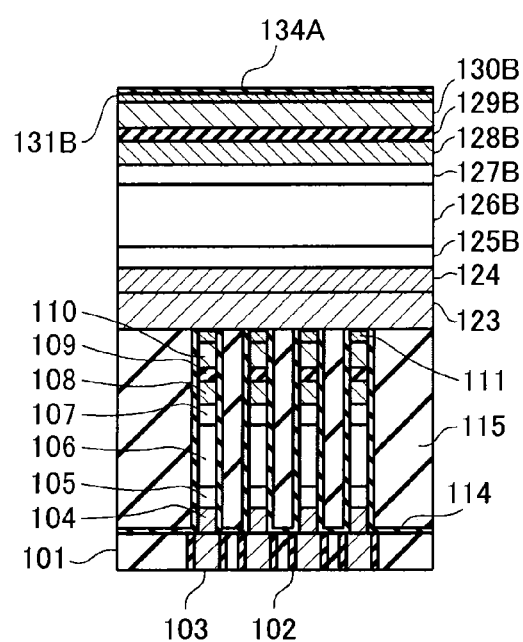
FIGS. 20A and 20B are a top view and a side view for explaining a method for making the semiconductor memory device.
Figure 20B:
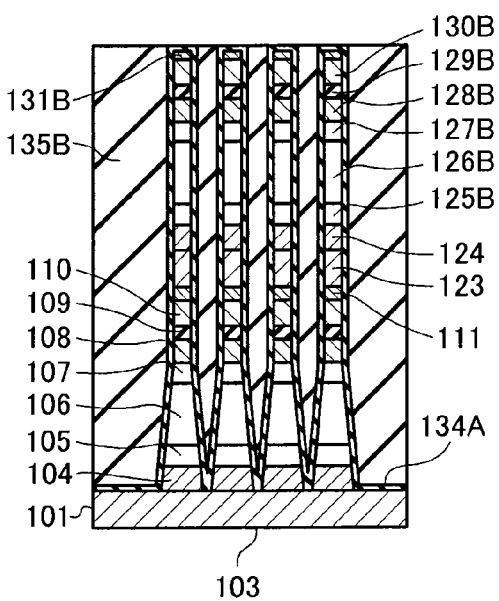
Figure 21A:
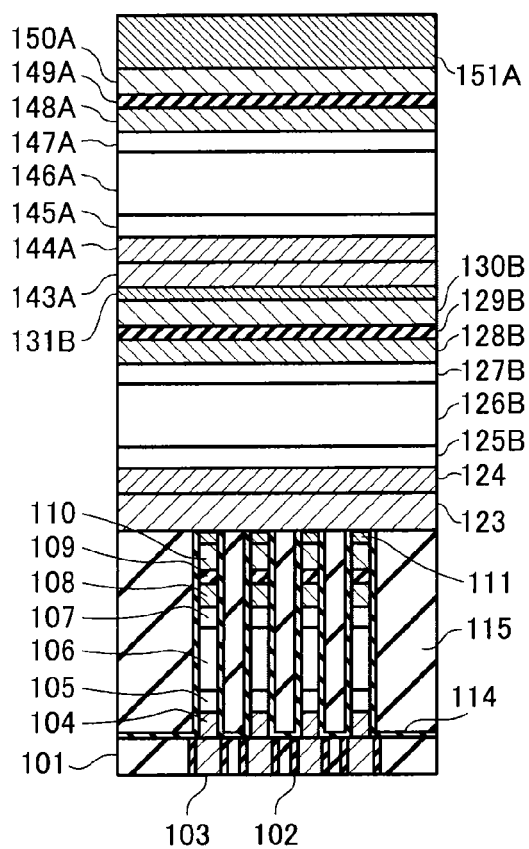
FIGS. 21A and 21B are a top view and a side view for explaining a method for making the semiconductor memory device.
Figure 21B:
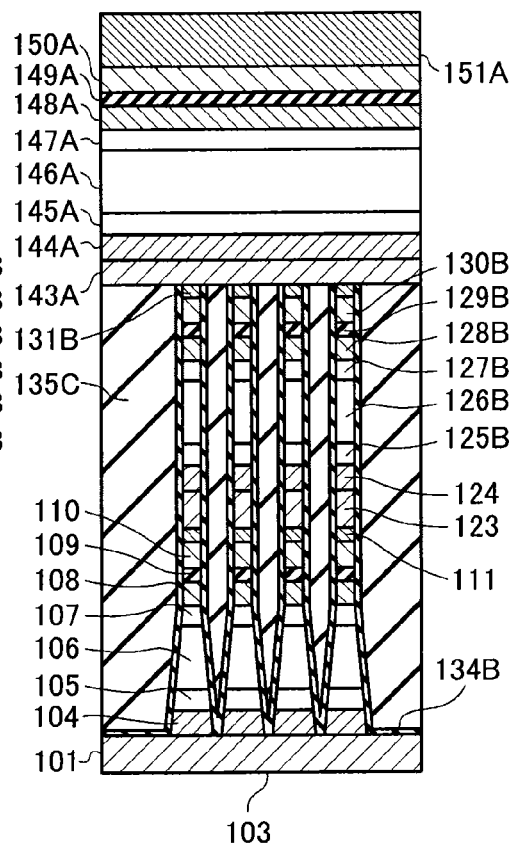

Subsequently, as shown in FIGS. 19A and 19B, an inter-layer insulating layer 135A is deposited, and steam oxidation is performed. However, if the inter-layer insulating layer 135A is not a coating layer, steam oxidation processing is not necessary. Thereafter, as shown in FIGS. 20A and 20B, the inter-layer insulating layer 135A is subjected to CMP, and the insulating layer 134A is exposed, so that an inter-layer insulating layer 135B is formed. Subsequently, as shown in FIGS. 21A and 21B, the exposed insulating layer 134A as well as the inter-layer insulating layer 135B are removed by CMP until the conductive layer 131B is exposed, so that the insulating layer 134B and the inter-layer insulating layer 135C are formed, and further, a semiconductor layer 143A serving as a bit line, a conductive layer 144A, an n-type semiconductor layer 145A, an i-type semiconductor layer 146A, a p-type semiconductor layer 147A, a conductive layer 148A serving as an electrode 148, a variable resistance layer 149A serving as a variable resistance element 149, a conductive layer 150A serving as an electrode 150, and a conductive layer 151A are deposited thereon. The materials for the conductive layer 144A to the conductive layer 151A may be the materials used in the layers corresponding to the respective layers from the conductive layer 144A to the conductive layer 151A.

Thereafter, as shown in FIGS. 22A and 22B, an HM layer 152 and a resist pattern 153 are deposited. The resist pattern 153 is a line-and-space formed to be parallel to the bit lines BL. The HM layer 152 may be made of the same materials as the materials for the HM layer 132.

Thereafter, as shown in FIGS. 23A and 23B, etching is performed according to the same steps as those explained in FIGS. 11A to 15C, and an insulating layer and an inter-layer insulating layer are deposited. Accordingly, an insulating layer 154B and an inter-layer insulating layer 155C are formed by CMP. At this occasion, the p-type semiconductor 125, the i-type semiconductor 126, and the n-type semiconductor 127 are formed to be the tapered type diode DI. At this occasion, a lower part of the diode DI may be in contact with an adjacent diode DI. Hereinafter, a memory cell array 1 having a stacked layer structure is formed on the basis of the same steps as those explained in FIGS. 16A to 23B.

In the first embodiment explained above, MC1 in the first layer includes the diode DI in the NIP type from the bottom, and MC2 in the second layer includes the diode DI in the PIN type from the bottom. Alternatively, MC1 in the first layer may include the diode DI in the PIN type from the bottom, and MC2 in the second layer may include the diode DI in the NIP type from the bottom. In this case, wires below MC1 are word lines WL.

Second Embodiment

Subsequently, a second embodiment will be explained with reference to FIGS. 24A and 24B. The semiconductor memory device according to the present embodiment has substantially the same configuration as the semiconductor memory device according to the first embodiment, but is different therefrom in the following points. More specifically, in the present embodiment, the impurity concentrations of both of the p-layers and the n-layers of all the current control elements DI are configured to have the profile A or the profile B. When the impurity concentrations of both of the p-layers and the n-layers of all the current control elements DI have the profile A, only the current control elements DI of the NIP structure are formed in the tapered type. When the impurity concentrations of both of the p-layers and the n-layers of all the current control elements DI have the profile B, only the current control elements DI of the PIN structure are formed in the tapered type.

Figure 24A:
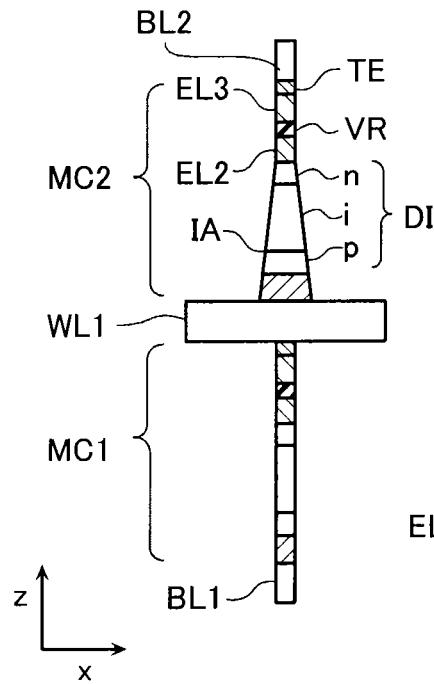
FIGS. 24A and 24B are cross sectional views illustrating a configuration of a memory cell of a semiconductor memory device according to a second embodiment.
Figure 24B:
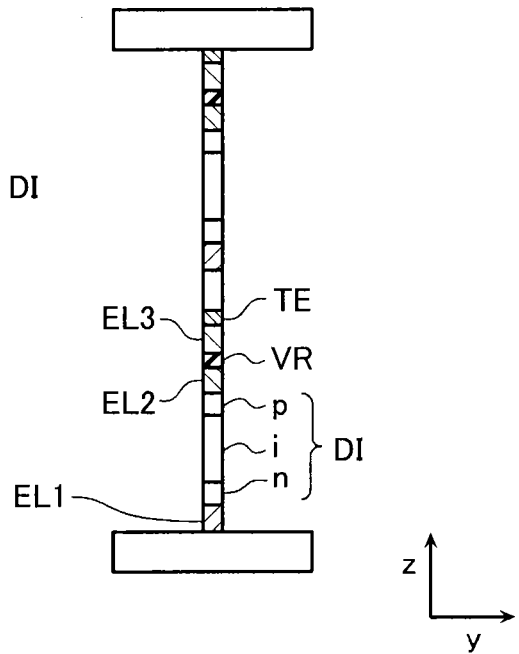

FIGS. 24A and 24B illustrate an example where the memory cells MC in both of the odd-numbered layers and the even-numbered layers are made of the profile A. In this case, the memory cell array MC2 is formed in a tapered type, and the memory cell array MC1 is formed in a rectangular pillar shape.

According to the semiconductor memory device according to the present embodiment, it is possible to reduce Vset of the memory cell MC included in the memory cell array in the odd-numbered layer or the even-numbered layer. Moreover, the p-layer and the n-layer of the diode DI in each layer of the memory cell array 1 are formed in the same impurity diffusion concentration profile, and therefore, the manufacturing process can be simplified.

In the present embodiment, the resistances of the memory cell MC in the odd-numbered layer and the memory cell MC in the even-numbered layer of the memory cell array 1 change, and therefore, it is necessary to perform adjustment using a peripheral circuit such as a column control circuit 2.

Third Embodiment

Figure 25A:
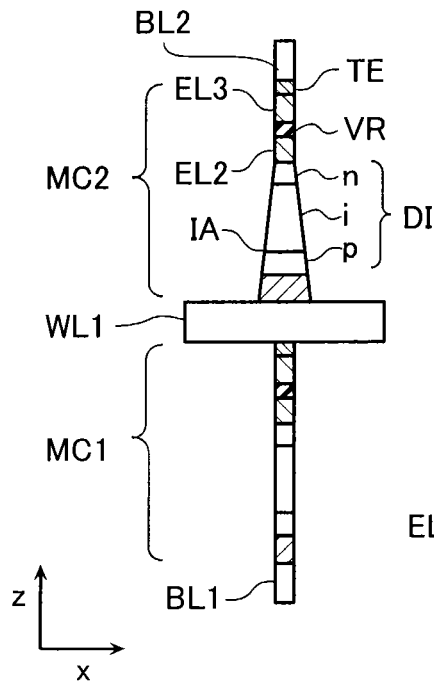
FIGS. 25A and 25B are cross sectional views illustrating a configuration of a memory cell of a semiconductor memory device according to a third embodiment.
Figure 25B:
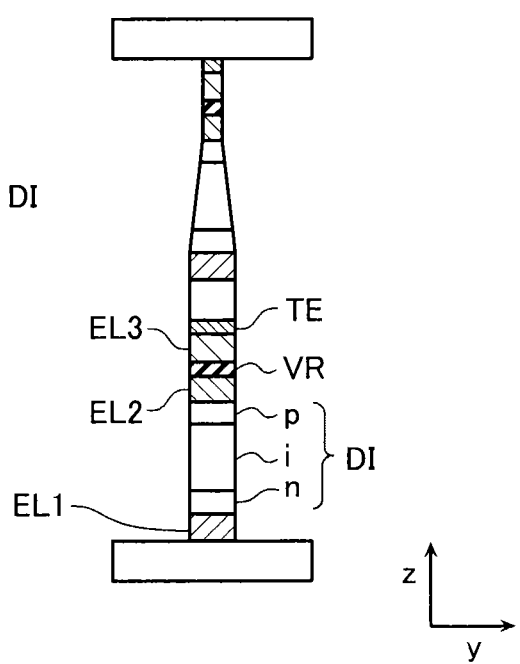

Subsequently, a third embodiment will be explained with reference to FIGS. 25A and 25B. The semiconductor memory device according to the present embodiment has substantially the same configuration as the semiconductor memory device according to the second embodiment, but is different therefrom in that a memory cell MC having a non-tapered current control element DI is formed to be thicker than a memory cell MC having a tapered current control element DI. FIGS. 25A and 25B illustrate an example where a memory cell MC0 formed in the rectangular pillar shape is formed to be thicker.

In addition to the advantages of the second embodiment, the semiconductor memory device according to the present embodiment has an advantage in that Vset can be reduced in the non-tapered current control element DI.

Like the second embodiment, the resistances of the memory cell in the odd-numbered layer and the memory cell in the even-numbered layer of the memory cell array 1 change in the present embodiment, and therefore, it is necessary to perform adjustment using a peripheral circuit such as a column control circuit 2.

Fourth Embodiment

Figure 26A:
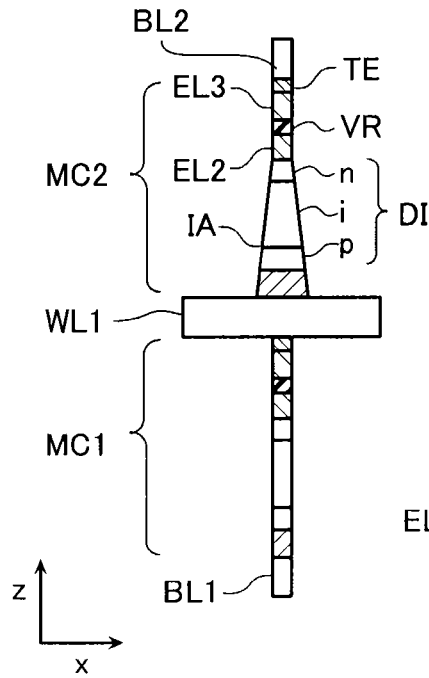
FIGS. 26A and 26B are cross sectional views illustrating a configuration of a memory cell of a semiconductor memory device according to a fourth embodiment.
Figure 26B:
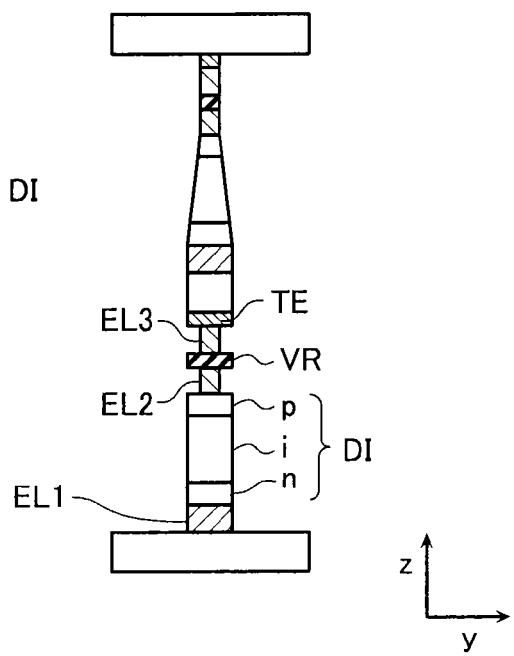

Subsequently, a fourth embodiment will be explained with reference to FIGS. 26A and 26B. The semiconductor memory device according to the present embodiment has substantially the same configuration as the semiconductor memory device according to the third embodiment, but is different therefrom in the following points. More specifically, in a memory cell MC having a rectangular pillar-shaped current control element DI, a diode DI, a variable resistance element VR, and a top electrode TE are formed to be thick, whereas an electrode EL2 and an electrode EL1 are formed to be thin. This kind of configuration can be achieved by combining RIE, wet etching, and the like. FIGS. 26A and 26B illustrate an example where the diode DI, the variable resistance element VR, and the top electrode TE of the memory cell MC0 formed in the rectangular pillar shape are formed to be thick, and the electrode EL2 and the electrode EL1 are formed to be thin.

The memory cell array 1 configured in this manner has the following two features. The first features is that in the current control elements DI of the even-numbered layer and the odd-numbered layer, surfaces that are likely to generate impact ion (i.e., the interface between the i-layer and the n-layer in the profile A, and the interface between the i-layer and the p-layer in the profile B) have the same size. According to this feature, Vset of the even-numbered layer and the odd-numbered layer can be reduced. The second feature is that in the even-numbered layer and odd-numbered layer, the sizes of contact areas between the variable resistance element VR and the electrode EL2 and electrode EL3 are the same. Due to this kind of features, the resistance of the memory cell MC of the even-numbered layer and the resistance of the memory cell MC of the odd-numbered layer can be made the same. According to this kind of configuration, in addition to the advantages of the third embodiment, it is possible to reduce variation in the electrical characteristics in the odd-numbered layers and even-numbered layers.

It should be noted that the configuration of the memory cell array 1 according to the present embodiment is not limited to the configuration as shown in FIGS. 26A and 26B, and may include the above two features. For example, in FIGS. 26A and 26B, in the memory cell MC1, the variable resistance element VR is configured to be thicker, and the electrodes EL2 and EL3 is configured to be thinner. Alternatively, the variable resistance element VR may be configured to be thinner, and the electrodes EL2 and EL3 may be configured to be thicker.

Fifth Embodiment

Figure 27A:
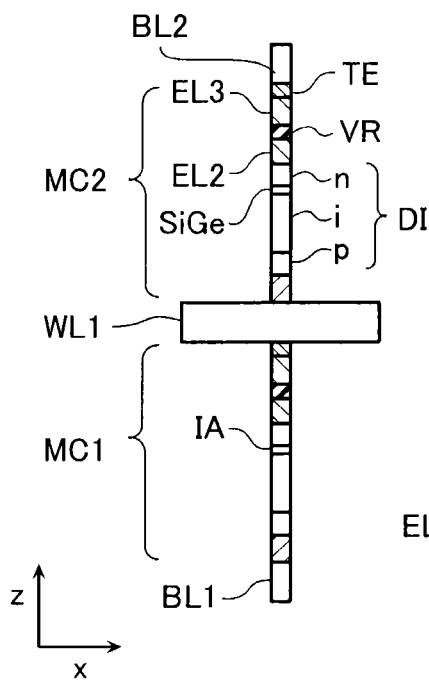
FIGS. 27A and 27B are cross sectional views illustrating a configuration of a memory cell of a semiconductor memory device according to a fifth embodiment.
Figure 27B:
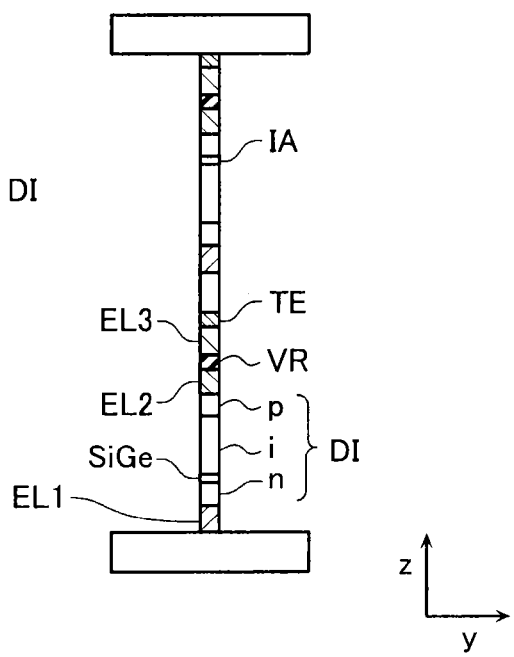

Subsequently, a fifth embodiment will be explained with reference to FIGS. 27A and 27B. The semiconductor memory device according to the present embodiment has substantially the same configuration as the semiconductor memory device according to the first embodiment, but is different therefrom in that the impurity concentrations of both of the p-layer and the n-layer in the current control element DI are configured to have the profile B, the diode DI is formed to be perpendicular to the surface of the inter-layer insulating layer 101, and a SiGe layer is formed between the p-layer and the i-layer of the diode DI. In the present embodiment, the impurity concentrations of both of the p-layer and the n-layer are configured to have the profile B. Alternatively, the impurity concentrations of both of the p-layer and the p-layer may also be configured to have the profile A. In this case, SiGe is formed between the n-layer and the i-layer of the diode DI.

Since the bandgap width of SiGe is narrower than semiconductors such as Si, Vset can be reduced when SiGe is formed at the interface between the p-layer and the i-layer where impact ion is likely to be generated. Therefore, the layer formed at the interface between the p-layer and the i-layer may be made of a material having a relatively narrower bandgap width than the semiconductor constituting the p-layer and the i-layer, and it may not be necessarily SiGe.

According to the semiconductor memory device according to the present embodiment, Vset can be reduced without adjusting impurity diffusion concentration and forming tapered shape.

Figure 28A:
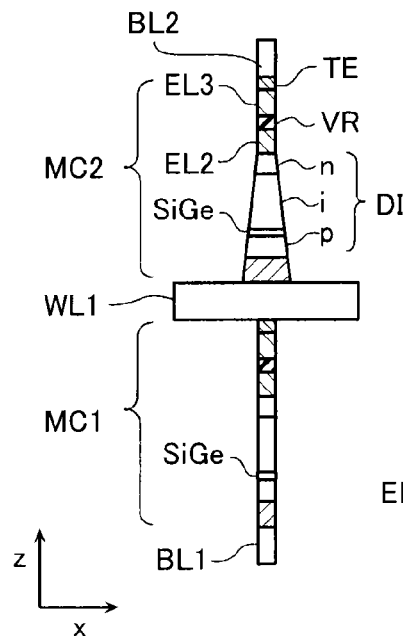
FIGS. 28A and 28B are cross sectional views illustrating another configuration of a memory cell of a semiconductor memory device according to the fifth embodiment.
Figure 28B:
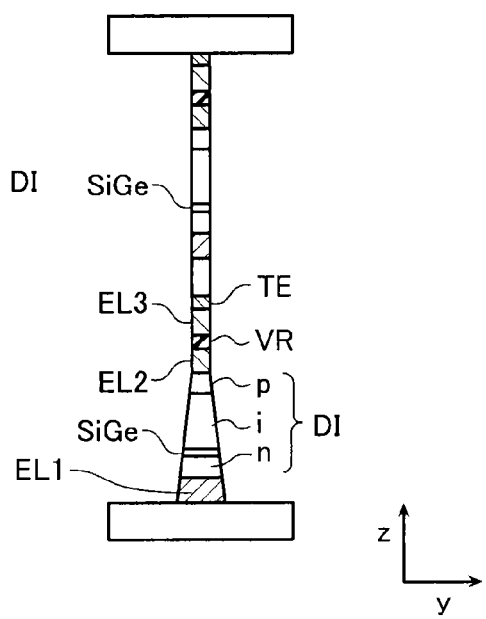
Figure 29A:
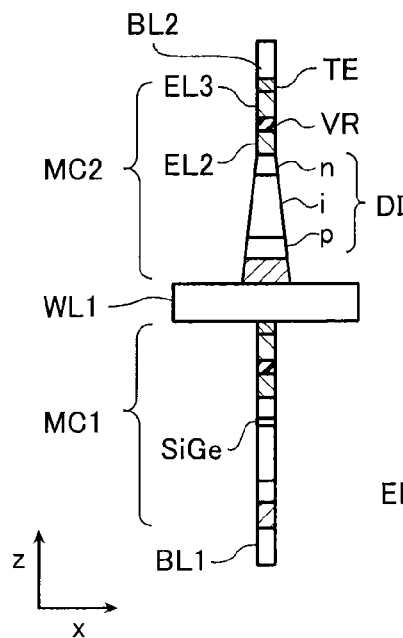
FIGS. 29A and 29B are cross sectional views illustrating still another configuration of a memory cell of a semiconductor memory device according to the fifth embodiment.
Figure 29B:
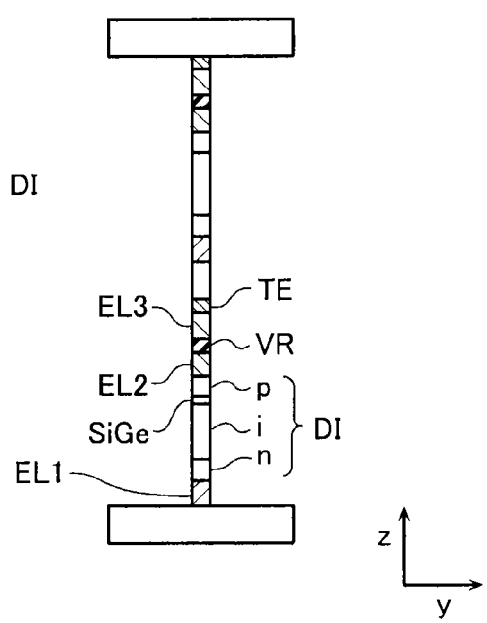
Figure 30A:
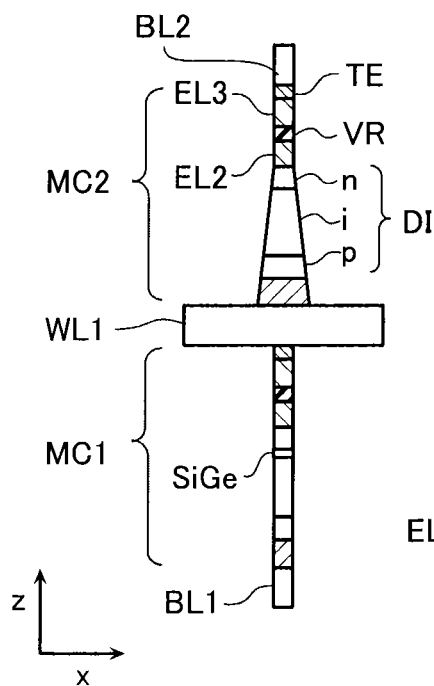
FIGS. 30A and 30B are cross sectional views illustrating still another configuration of a memory cell of a semiconductor memory device according to the fifth embodiment.
Figure 30B:
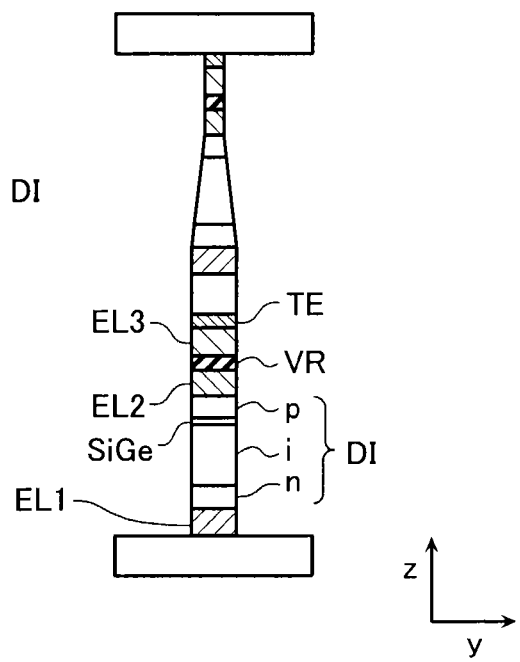
Figure 31A:
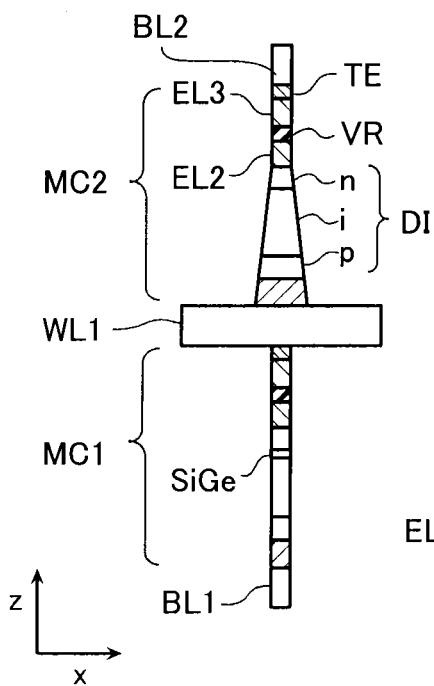
FIGS. 31A and 31B are cross sectional views illustrating still another configuration of a memory cell of a semiconductor memory device according to the fifth embodiment.
Figure 31B:
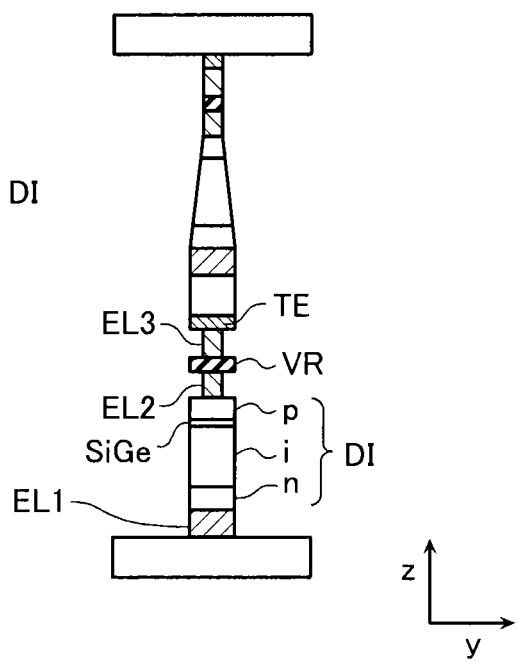

In the present embodiment, the diode DI is formed to be perpendicular to the surface of the inter-layer insulating layer 101, but as shown in FIGS. 28A and 28B, the diode DI may be formed in a tapered shape as shown in other embodiments, and as shown in FIG. 29A to FIG. 31B, a combination can be made in the odd-numbered layers and the even-numbered layers. In the former case, like the first to fourth embodiments, the even-numbered layers and the odd-numbered layers need to be made to have different impurity concentrations, but in the latter case, the impurity concentrations of both of the p-layer and the p-layer can be configured to have the profile B or A. The impurity concentrations of the p-layer and n-layer in the current control element DI can be the same as those of the first embodiment. By adjusting the shape of the diode DI and the impurity concentrations of the p-layer and n-layer as described above, Vset can be further reduced.

In the above embodiments, the bit lines 103 and the memory cell array 1 are made separately, but may be formed at the same time by etching process. In this case, the bit lines 103 and the memory cell array 1 are self-aligned, and it is easy to position the memory cell array 1 and the bit lines.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a cell array layer including a first wire, a memory cell stacked on the first wire, and a second wire formed on the memory cell so as to cross the first wire,
   the memory cell including a variable resistance element that is electrically rewritable by applying an electric signal having a different polarity and a current control element connected in series and passing currents in both directions through the variable resistance element,
   the current control element including:
   a first conductivity-type semiconductor into which a first impurity is doped;
   an i-type semiconductor in contact with the first conductivity-type semiconductor;
   a second conductivity-type semiconductor into which a second impurity is doped, and the second conductivity-type semiconductor being in contact with the i-type semiconductor opposite to the first conductivity-type semiconductor; and
   an impact ionization acceleration unit being formed between the i-type semiconductor and one of the first conductivity-type semiconductor and the second conductivity-type semiconductor, the impact ionization acceleration unit generating more impact ions than between the i-type semiconductor and the other of the first conductivity-type semiconductor and the second conductivity-type semiconductor, wherein
   a diffusion length of the second impurity in the second conductivity-type semiconductor is longer than a length of the i-type semiconductor in a direction where the i-type semiconductor and the second conductivity-type semiconductor are arranged, and
   the impact ionization acceleration unit is formed in a junction portion between the first conductivity-type semiconductor and the i-type semiconductor.

2. The semiconductor memory device according to claim 1, wherein a size of junction area between the first conductivity-type semiconductor and the i-type semiconductor is larger than a size of junction area between the second conductivity-type semiconductor and the i-type semiconductor.

3. The semiconductor memory device according to claim 2, wherein the cell array layer includes a plurality of memory cells arranged on the first wire along the first wire,
   the current control element is arranged such that the first conductivity-type semiconductor is arranged at the first wire, and is formed in a tapered shape in which a width in a direction in which the first wire extends increases from the second conductivity-type semiconductor to the first conductivity-type semiconductor.

4. The semiconductor memory device according to claim 1, wherein the impact ionization acceleration unit includes a layer provided between the first conductivity-type semiconductor and the i-type semiconductor and is made of a material of which bandgap is narrower than those of the first conductivity-type semiconductor, the second conductivity-type semiconductor and the i-type semiconductor.

5. The semiconductor memory device according to claim 4, wherein the material having the narrower bandgap is SiGe.

6. A semiconductor memory device comprising:
   a first cell array layer including a first wire, a first memory cell stacked on the first wire, and a second wire formed on the first memory cell so as to cross the first wire; and
   a second cell array layer including a second wire, a second memory cell stacked on the second wire, and a third wire formed on the second memory cell so as to cross the second wire,
   the first memory cell including a first variable resistance element that is electrically rewritable by applying an electric signal having a different polarity and a first current control element connected to the first variable resistance element in series and passing currents in both directions through the first variable resistance element,
   the second memory cell including a second variable resistance element that is electrically rewritable by applying an electric signal having a different polarity and a second current control element connected to the second variable resistance element in series and passing currents in both directions through the second variable resistance element,
   the first current control element including:
   a first conductivity-type first semiconductor into which a first impurity is doped;
   an i-type first semiconductor stacked on the first conductivity-type first semiconductor; and
   a second conductivity-type first semiconductor into which a second impurity is doped and which is stacked on the i-type first semiconductor,
   the second current control element including:
   a second conductivity-type second semiconductor into which a second impurity is doped;
   an i-type second semiconductor stacked on the second conductivity-type second semiconductor; and
   a first conductivity-type second semiconductor into which a first impurity is doped and which is stacked on the i-type second semiconductor, and
   an impact ionization acceleration unit being formed at least one of between the i-type first semiconductor and the first or second conductivity-type first semiconductor and between the i-type second semiconductor and the first or second conductivity-type second semiconductor, wherein
   a diffusion length of the first impurity in the first conductivity-type second semiconductor is longer than a length of the i-type second semiconductor in a direction where the i-type second semiconductor and the second conductivity-type second semiconductor are stacked, and
   the impact ionization acceleration unit is formed in a junction portion between the second conductivity-type second semiconductor and the i-type second semiconductor.

7. The semiconductor memory device according to claim 6, wherein a size of junction area between the first conductivity-type first semiconductor and the i-type first semiconductor is larger than a size of junction area between the second conductivity-type first semiconductor and the i-type first semiconductor.

8. The semiconductor memory device according to claim 7, wherein the cell array layer includes a plurality of first memory cells arranged on the first wire along the first wire, and the first current control element is arranged such that the first conductivity-type first semiconductor is arranged at the first wire, and is formed in a tapered shape in which a width in a direction in which the first wire extends increases from the second conductivity-type first semiconductor to the first conductivity-type first semiconductor.

9. The semiconductor memory device according to claim 6, wherein a size of junction area between the second conductivity-type second semiconductor and the i-type second semiconductor is larger than a size of junction area between the first conductivity-type second semiconductor and the i-type second semiconductor.

10. The semiconductor memory device according to claim 9, wherein the second cell array layer includes a plurality of second memory cells arranged on the second wire along the second wire, the second current control element is arranged such that the second conductivity-type second semiconductor is arranged at the second wire, and is formed in a tapered shape in which a width in a direction in which the second wire extends increases from the first conductivity-type second semiconductor to the second conductivity-type second semiconductor.

11. The semiconductor memory device according to claim 10, wherein the first current control element is formed in a rectangular pillar shape.

12. The semiconductor memory device according to claim 11, wherein a cross section perpendicular to a stacking direction of the first current control element formed in the rectangular pillar shape is larger than a cross section perpendicular to a stacking direction at an upper end of the second current control element formed in the tapered shape.

13. The semiconductor memory device according to claim 6, wherein a diffusion length of the first impurity in the first conductivity-type first semiconductor is longer than a length of the i-type first semiconductor in a direction where the i-type first semiconductor and the second conductivity-type first semiconductor are stacked, and the impact ionization acceleration unit is formed in a junction portion between the second conductivity-type first semiconductor and the i-type first semiconductor.

* * * * *